Dec. 1, 1964 E. M. ARAKELIAN 3,159,789
SQUELCH CIRCUIT WITH DISCRIMINATOR LOADING SUCH THAT NOISE VOLTAGE IS NOT PASSED BY INTERELECTRODE CAPACITANCE OF AUDIO SECTION
Filed Oct. 16, 1962
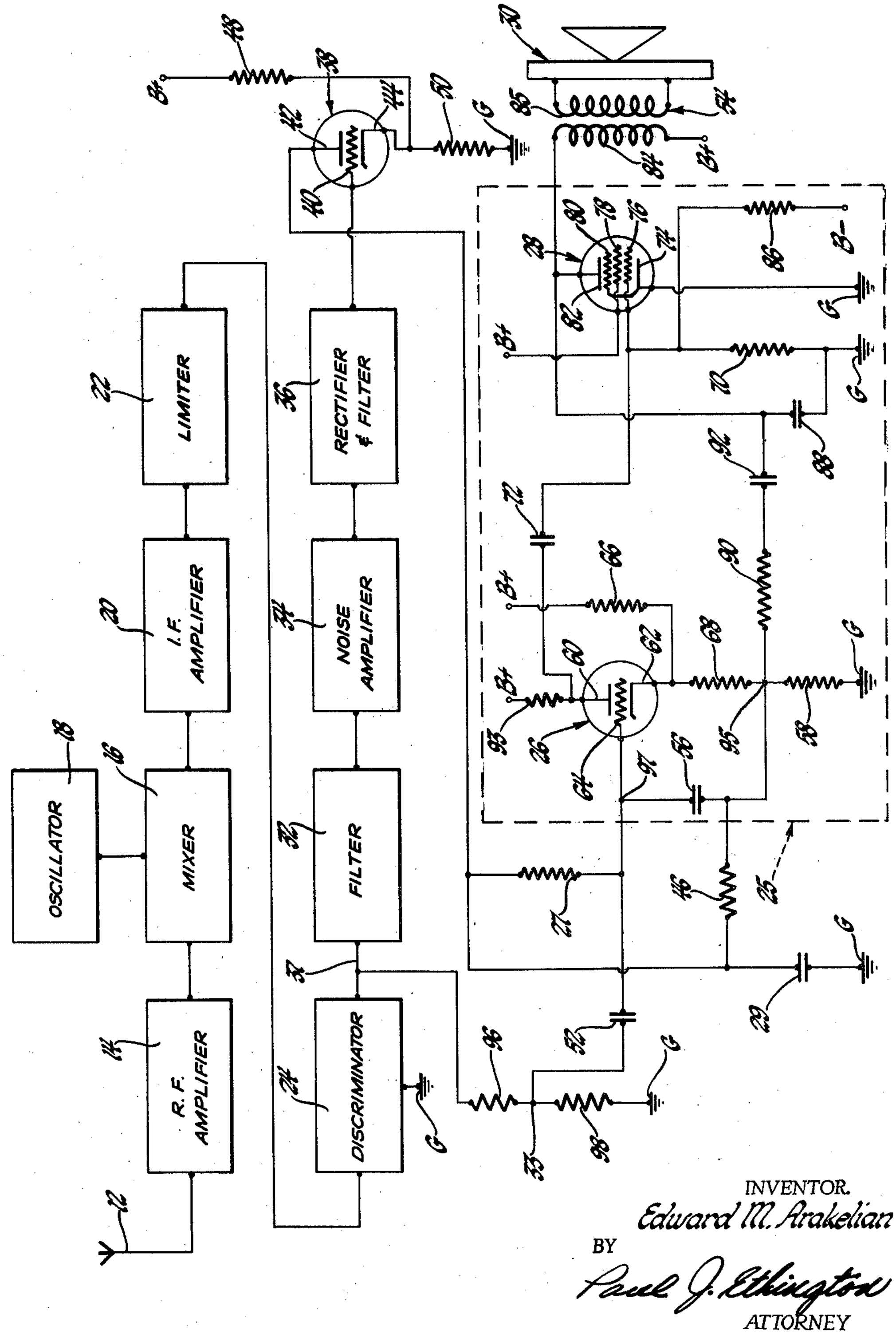
INVENTOR.
Edward M. Arakelian
BY
Paul J. Ethington
ATTORNEY 3,159,789

SQUELCH CIRCUIT WITH DISCRIMINATOR LOADING SUCH THAT NOISE VOLTAGE IS NOT PASSED BY INTERELECTRODE CAPACITANCE OF AUDIO SECTION

Edward M. Arakelian, Kokomo, Ind., assignor to General Motors Corporation, Detroit, Mich., a corporation of Delaware Filed Oct. 16, 1962, Ser. No. 230,860
5 Claims. (Cl. 325—402)

This invention relates to radio receivers and more particularly to means for loading the audio channel of the detector section of a radio receiver when the receiver is muted by a squelch control section so as to prevent noise signal voltages from being applied through the interelectrode capacitance between the input and the output of the audio amplifier section to a load.

Radio receivers which utilize a squelch control section for muting the receiver when the magnitude of noise signal voltage developed by the detector section exceeds a predetermined value are well known in the prior art. However, even when such receivers are muted some noise signal voltage will be applied through the interelectrode capacitance between the input and output of the audio amplifier section to the speaker and may be heard in areas where the ambient noise level is low.

In accordance with this invention, means are provided for loading the audio channel of the detector section of a radio receiver when the receiver is muted by a squelch control section so as to prevent noise signal voltage from being applied through the interelectrode capacitance between the input and output of the audio amplifier section to a load. This is accomplished with a controllable impedance path connected across the input of the audio amplifier section whereby when the receiver is muted the effective impedance of the path is of low magnitude. This low impedance path loads the audio channel of the detector section thereby preventing noise signal voltage from being applied through the interelectrode capacitance between the input and output of the audio section to the load. Means are also provided for deactivating the path when the magnitude of the noise signal voltage decreases below a predetermined value. This is accomplished with the controllable impedance path whereby when the receiver is unmuted the effective impedance of the path is of high magnitude thus allowing the signal from the discriminator to flow freely without serious attenuation to the audio amplifier section.

A more complete understanding of this invention may be had from the detailed description which follows taken with the accompanying drawing in which the single figure is a schematic circuit diagram of one embodiment of the invention. Referring now to the diagram there is shown a radio receiver including an antenna 12 connected with a radio frequency 14 which is in turn connected to a mixer 16 in which a received radio frequency signal is heterodyned with a signal from a local oscillator 18. The heterodyned signal is then applied to an intermediate frequency amplifier 20 from which it is coupled to a limiter circuit 22 and from there to the input of a detector such as a frequency discriminator 24 which is grounded at G. The discriminator 24 is operative to demodulate audio modulated input signals which are applied to its input and to develop output signal voltage including noise signal voltage and audio signal voltage. The output signal voltage of the discriminator is conventionally directed to two separate paths, a squelch channel 31 and an audio channel 33. The output audio channel 33 is obtained between ground G and the junction between voltage divider resistors 98 and 96 connected between ground G and the output of the discriminator 24. The output squelch channel of the discriminator 24 is obtained between ground G and the output of discriminator 24. Output signal voltages from the audio channel 33 of discriminator 24 are applied through a coupling capacitor 52 and are amplified by an audio amplifier section 25 which includes an electronic control device such as a triode electron tube 26 connected in cascade with another electronic control device such as a pentode electron tube 28 and applied to a suitable speaker 30 via a transformer 54. The discriminator 24 has a high internal impedance designed to permit efficient operation of the receiver.

The audio amplifier tube 26 is provided with a squelch control circuit for muting the receiver when the magnitude of the noise signal voltage from the discriminator 24 exceeds a predetermined value. The squelch control circuit includes a filter 32 having its input connected with the squelch channel 31 of the discriminator 24, a noise amplifier 34 having its input connected with the output of the filter 32, and a rectifier and smoothing filter 36 having its input connected with the output of the noise amplifier 34. A squelch control electron tube 38 is provided comprising an anode 42, a control grid 40 and a cathode 44 and has its control grid 40 connected with the output of the rectifier and smoothing filter 36. The tube 38 has its anode 42 connected with a B+ voltage supply source via an anode resistor 46 and a B+ voltage divider consisting of series connected resistors 58, 68 and 66. A cathode resistor 50 is connected between ground G and the cathode 44 of the tube 38 and in series with a resistor 48 connected with the B+ voltage supply source for providing cathode bias voltage to the tube 38. A smoothing capacitor 29 is connected between ground G and the anode 42 of the tube 38 for smoothing the output voltages from the tube 38. A coupling resistor 27 connects the anode 42 of the tube 38 with the control grid of the audio amplifier tube 26 for applying output voltages from tube 38 to the tube 26.

The filter 32 operates to reject output signal voltage from the squelch channel 31 of the discriminator 24 which is in the speech range and to pass noise signal voltage which is above the speech range. Since the distribution of noise throughout the spectrum is known, the noise signal voltage passed by the filter 32 is related to the noise within the audio range. The noise signal voltage is amplified by the noise amplifier 34 and applied to the rectifier and smoothing filter 36 which develops a control voltage of positive polarity which is proportional to the noise signal voltage. The control voltage is applied to the control grid 40 of the squelch control tube 38 so that an increasing control voltage causes the tube 38 to become more conductive resulting in a negative going voltage on its anode 42. The negative going voltage existing on the anode 42 of the tube 38 is applied across the smoothing capacitor 29 and coupled to the control grid of the audio amplifier tube 26 via the coupling resistor 27. Upon a predetermined magnitude of the control voltage as determined by the bias voltages of the audio amplifier tube 26 the negative going voltage obtained from the anode 42 of the squelch control tube 38 will be sufficient to cut off the tube 26 so as to mute the receiver.

The circuitry described thus far is well known in the prior art and requires no further discussion for its complete understanding. One problem existing in the circuit is that even when the receiver is muted, some audio range noise signal voltage from the audio channel 33 of the discriminator 24 will be applied through the coupling capacitor 52 to the control grid of the audio amplifier tube 26 and through the grid to anode interelectrode capacitance of the tube 26 to the control grid of the audio amplifier tube 28. The noise signal voltage will be amplified by the amplifier tube 28 and coupled through the transformer 54 to the speaker 30 and may be heard in areas when the ambient noise level is low.

In accordance with this invention, the audio amplifier tube 26 is provided with a controllable impedance path from its control grid to ground G so as to load the audio channel 33 of the discriminator 24 when the receiver is muted. The controllable impedance path takes the form of a capacitor 56 connected in series with the resistor 58 across the output of the audio channel 33 of the discriminator 24. Means are connected with the controllable impedance path to effectively decrease its impedance when the receiver is muted from its passive value for noise voltages in the medium and high end of the audio frequency spectrum. The means provide for voltages opposing in phase across opposite terminals of the capacitor 56 to thereby increase the voltage drop thereacross and include a degenerative feedback path connected between the anode of tube 28 and the junction of resistor 58 and capacitor 56. The path provides sufficient attenuation of noise signal voltage from the audio channel 33 of the discriminator 24 when the receiver is muted so that no appreciable noise singal voltage is applied through the grid to the anode interelectrode capacitance of the audio amplifier tube 26 to the control grid of the audio amplifier tube 28. Moreover, means are connected with the controllable impedance path to effectively increase its impedance when the receiver is not muted so as to prevent audio signal voltage developed by the discriminator 24 from being seriously attenuated at the input of amplifier tube 28. The means include the resistor 58 in the controllable impedance path which resistor is also connected with the cathode circuit of tube 26 so that when the tube 26 is conducting with normal grid-to-cathode bias applied, nearly equal voltage in phase and in amplitude to the output voltage from the audio channel of discriminator 24 is applied across opposite terminals of the capacitor 56 by the amplifying action of amplifier tubes 26 and 28, and the degenerative feedback path connected between the cathode circuit of tube 26 and the anode of amplifier tube 28 and the local degeneration provided in the cathode circuit of tube 26 by the resistor 58. The invention will be more readily understood with the following detailed description of the audio amplifier section 25 and the description of operation which follows thereafter.

The audio amplifier tube 26 comprises an anode 60, a cathode 62 and a control grid 64. The control grid 64 of the tube 26 is electrically connected with one terminal of the capacitor 56 forming a junction 97 and with the audio channel 33 of the discriminator 24 via the coupling capacitor 52. The anode 60 of the tube 26 is connected with the B+ voltage supply source via an anode resistor 93. A cathode resistor 68 is connected between the cathode 62 of the tube 26 and ground G via the resistor 58. The resistors 58 and 68 are also connected in series between ground G and the B+ voltage supply source via the resistor 66 forming a voltage divider circuit as mentioned hereinbefore. This voltage divider network provides: grid-to-cathode bias for amplifier tube 26, B+ voltage supply for the squelch control tube 38, and grid bias voltage for amplifier tube 26 when the squelch control tube 38 is biased to cut off.

The audio amplifier tube 28 comprises a cathode 74, a control grid 76, a screen grid 78, a suppressor grid 80 and an anode 82. The suppressor grid 80 and the cathode 74 are connected in common with ground G. The screen grid 78 of the tube 28 is directly connected with the B+ voltage supply source and the anode 82 is connected with the B+ voltage supply source via a primary winding 84 on the transformer 54. The control grid 76 of the tube 28 is connected with a B— voltage supply source via a bias resistor 86. A grid resistor 70 is connected between ground G and the control grid 76 of the tube 28. The output voltage obtained from the audio amplifier tube 26 is applied across the resistor 70 and to the control grid 76 of the audio amplifier tube 28. A de-emphasis circuit is provided for the amplifier tube 28 and includes a capacitor 88 connected between ground G and the anode 82 of the tube 28 and a degenerative feedback path comprising a resistor 90 and a capacitor 92 connected between a junction 95 between resistors 58 and 68 and the anode 82 of the tube 28. The speaker 30 is connected across a secondary winding 85 on the transformer 54 so as to develop audio signals in accordance with output voltages obtained from the audio amplifier tube 28.

When the magnitude of the noise signal voltage developed by the discriminator 24 exceeds a pre-determined value the squelch control tube 38 is operative to mute the receiver as described hereinbefore. With the receiver muted, audio range noise signal voltage developed by the discriminator 24 will be applied through the audio channel 33 and the coupling capacitor 52 and the controllable impedance path including the capacitor 56 and the resistor 58 to ground G. Thus essentially all of the noise signal voltage will be applied across the internal impedance of the discriminator 24 and only negligible noise signal voltage will be applied through the interelectrode capacitance from the control grid 64 to the anode 60 of the tube 26. The loading of the audio channel of the discriminator 24 is aided by the degenerative feedback path including the resistor 90 and capacitor 92 since the path provides voltages opposing in phase across opposite terminals of capacitor 56. Thus the voltage drop across capacitor 56 is increased and hence the impedance of the audio section as seen by the audio channel output of the discriminator 24 is decreased. However, if a radio frequency carrier wave is now received the inherent quieting action of the receiver will reduce the magnitude of noise signal voltage developed at the output of the discriminator 24 and the squelch control tube 38 will be rendered non-conductive. With the squelch tube 38 non-conductive, the potential on its anode 42 will be clamped to the potential of junction 95 as the direct current path through resistor 46 is now blocked. Similarly, the potential of junction 95 is applied from anode 42 through resistor 27 to the grid 64 of the audio amplifier tube 26. The direct current voltage drop across resistor 68 establishes the desired grid-to-cathode bias for voltage amplifier operation of the audio amplifier tube 26. Since tube 26 is conducting, local and overall degenerative feedback is now operative and for audio frequencies applied from the audio channel 33 to junction 97 a near identical voltage (in phase and amplitude) is developed at junction 95. Since the current through capacitor 56 is determined by the potential difference across its terminals, and this potential drop is minimized by the above operation when the receiver is unmuted, the current loading on the audio channel is effectively removed. The controllable impedance path from grid 64 through capacitor 56 and resistor 58 to signal ground G is thereby increased so as to prevent serious attenuation of the audio signal voltage obtained from the discriminator 24.

Reduction of the loading of the audio channel of the discriminator 24 when the receiver is unmuted is mostly effected with the overall degenerative feedback path including the resistor 90 and capacitor 92 from the anode 82 of the tube 28 to the junction 95 because the signal input to grid 64 of tube 26 receives the amplifier action of tubes 26 and 28 and proper phasing such that the signal returned to junction 95 is magnified and degenerative.

Although the description of this invention has been given with respect to a particular embodiment, it is not to be construed in a limiting sense. Numerous variations and modifications within the spirit and scope of the invention will now occur to those skilled in the art. For a definition of the invention, reference is made to the appended claims.

I claim:

1. Means for loading the audio channel of the detector section of a radio receiver when the receiver is muted by a squelch control means so as to prevent noise signal voltage from being applied through the interelectrode capacitance between the input and output of the audio amplifier section to a load and comprising a detector having an input and an output, the output of the detector including an audio channel and a squelch channel, means for applying audio modulated input signals to the input of the detector which is operative to demodulate the input signals and to develop output signal voltage including noise signal voltage and audio signal voltage, an audio amplifier electronic control device having an input and an output with interelectrode capacitance present therebetween, the audio channel output of the detector connected with the input of the control device, squelch control means having an input and an output connected with the squelch channel output of the detector and the input of the control device, respectively, a load connected across the output of the control device, a controllable impedance path to the output signal voltage connected across the input of the control device whereby when the magnitude of the noise signal voltage exceeds a predetermined value the squelch control means is operative to apply sufficient cut-off potential to the input of the control device to mute the receiver so that the controllable impedance path loads the audio channel of the detector to prevent noise signal voltage from being applied through the interelectrode capacitance between the input and output of the control device to the load, and means connected with the controllable impedance path for deactivating the path when the magnitude of noise signal voltage decreases below a predetermined value.

2. Means for loading the audio channel of the detector section of a radio receiver when the receiver is muted by a squelch control means so as to prevent noise signal voltage from being applied through the interelectrode capacitance between the input and output of the audio amplifier section to a load as claimed in claim 1 wherein the controllable impedance path includes a capacitor, and wherein the means connected with the controllable impedance path for deactivating the path includes means for developing opposing potentials on opposite terminals of the capacitor when the receiver is not muted so as to decrease the loading of the audio channel of the detector section.

3. In a radio receiver, a detector having an input and an output, the output of the detector including an audio channel and a squelch channel, means for applying audio modulated input signals to the input of the detector which is operative to demodulate the input signals and to develop output signal voltage including noise signal voltage and audio signal voltage, an audio amplifier electron tube including an anode, a cathode and a control grid, the audio channel output of the detector connected with the control grid of the audio amplifier tube, squelch control means having an input and an output connected with the squelch channel output of the detector and the control grid of the audio amplifier tube, respectively, a capacitor connected between the cathode and the control grid of the audio amplifier tube, a load connected with the anode of the audio amplifier tube, and a controllable impedance path to the output signal voltage including the capacitor and a resistor connected together in series across the audio channel output of the detector whereby when the magnitude of the noise signal voltage exceeds a predetermined value the squelch control means is operative to apply sufficient cut-off potential to the control grid of the audio amplifier tube to cut off the audio amplifier tube so that the controllable impedance path loads the audio channel of the detector to prevent the noise signal voltage from being applied through the grid to anode interelectrode capacitance of the audio amplifier tube to the load, the junction of the capacitor and the resistor connected with the cathode of the audio amplifier tube whereby when the magnitude of the noise signal voltage decreases below a predetermined value the rise in potential on the control grid of the audio amplifier tube will be accompanied by a rise in potential at the junction between the capacitor and the resistor so that the potentials existing on opposite terminals of the capacitor oppose each other so as to decrease the loading of the audio channel of the detector.

4. In a radio receiver, a detector having an input and an output, the output of the detector including an audio channel and a squelch channel, means for applying audio modulated input signals to the input of the detector which is operative to demodulate the input signals and to develop output signal voltage including noise signal voltage and audio signal voltage, an audio amplifier electron tube including an anode, a cathode and a control grid, the audio channel output of the detector connected with the control grid of the audio amplifier tube, squelch control means having an input connected with the squelch channel output of the detector and an output connected with the control grid of the audio amplifier tube, a capacitor having one terminal connected with the control grid of the audio amplifier tube and another terminal connected with the cathode of the audio amplifier tube via a first resistor, an audio amplifier electronic control device having an input and an output, the input of the control device connected with the anode of the audio amplifier tube, a controllable impedance path to the output signal voltage including the capacitor in series with a second resistor across the audio channel output of the detector whereby when the magnitude of the noise signal voltage exceeds a predetermined value the squelch control means is operative to apply sufficient cut-off potential to the control grid of the audio amplifier tube to cut off the audio amplifier tube so that the controllable impedance path loads the audio channel of the detector to prevent the noise signal voltage from being applied through the grid to anode interelectrode capacitance of the audio amplifier tube to the input of the control device, a degenerative feedback path connecting the output of the control device with the junction between the first and second resistors whereby when the magnitude of the noise signal voltage decreases below a predetermined value the rise in potential on the control grid of the audio amplifier tube will be accompanied by a rise in potential at the junction of the first and second resistors so that the potentials existing on opposite terminals of the capacitor will oppose each other so as to decrease the loading of the audio channel of the detector, and a load connected with the output of the control device.

5. In a radio receiver, a detector having an input and an output, the output of the detector including an audio channel and a squelch channel, means for applying audio modulated input signals to the input of the detector which is operative to demodulate the input signals and to develop output signal voltage including noise signal voltage and audio signal voltage, a first audio amplifier electron tube including an anode, a cathode and a control grid, the audio channel output of the detector connected with the control grid of the first electron tube, squelch control means having an input connected with the squelch channel output of the detector and an output connected with the control grid of the first electron tube, a capacitor having one terminal connected with the control grid of the first electron tube and another terminal connected with the cathode of the first electron tube via a first resistor, a second audio amplifier electron tube having an anode, a cathode and a control grid, a grid resistor having one terminal connected in common with the cathode of the second electron tube and another terminal connected in common with the anode of the first electron tube and the control grid of the second electron tube, a controllable impedance path to the output signal voltage including the capacitor in series with a second resistor across the audio channel output of the detector whereby when the magnitude of the noise signal voltage exceeds a predetermined value the squelch control means is operative to apply sufficient cut-off potential to the control grid of the first electron tube to cut off the first electron tube so that the controllable impedance path loads the audio channel of the detector so as to prevent the noise signal voltage from being applied through the grid to anode interelectrode capacitance of the first electron tube to the control grid of the second electron tube, a degenerative feedback path connecting the anode of the second audio amplifier tube with the junction between the first and second resistors whereby when the magnitude of the noise signal voltage decreases below a predetermined value the rise in potential on the control grid of the first electron tube will be accompanied by a rise in potential at the junction of the first and second resistors so that the potentials existing on opopsite terminals of the capacitor will oppose each other so as to decrease the loading of the audio channel of the detector, and speaker means connected with the anode of the second electron tube for developing audio signals.

No references cited.